United States Patent [19]

Wakabayashi et al.

[11] Patent Number: 5,026,752

[45] Date of Patent: Jun. 25, 1991

[54] AMORPHOUS-POLYPROPYLENE-BASED HOT MELT ADHESIVE

[75] Inventors: Toshinori Wakabayashi; Shinji Sugii, both of St. Paul, Minn.

[73] Assignee: Minnesota Mining and Manufacturing Company, St. Paul, Minn.

[21] Appl. No.: 399,366

[22] Filed: Aug. 28, 1989

Related U.S. Application Data

[63] Continuation of Ser. No. 175,933, Mar. 31, 1988, abandoned.

[51] Int. Cl.$^5$ .................. C08L 53/02; C08L 23/10
[52] U.S. Cl. .................................. 524/271; 524/487; 524/488; 524/505; 525/92; 525/93; 525/97; 525/98; 525/210
[58] Field of Search .................. 525/98, 92, 97; 428/484; 524/487, 488, 271

[56] References Cited

U.S. PATENT DOCUMENTS

| | | | |
|---|---|---|---|
| 3,632,540 | 1/1972 | Unmuth et al. | 525/98 |
| 3,686,107 | 8/1972 | Russell | 525/98 |
| 3,850,858 | 11/1974 | Park | 525/98 |
| 3,862,068 | 1/1975 | Russell | 260/27 |
| 3,900,694 | 8/1975 | Jurrens | 428/513 |
| 4,112,208 | 9/1978 | McConnell et al. | 526/57 |
| 4,143,858 | 3/1979 | Schmidt et al. | 526/48 |
| 4,186,258 | 1/1980 | Schmidt et al. | 525/342 |
| 4,357,459 | 11/1982 | Runavot et al. | 528/205 |
| 4,412,030 | 10/1983 | Runavot et al. | 524/505 |
| 4,509,821 | 4/1985 | Stenger | 524/487 |
| 4,539,364 | 9/1985 | Pollet et al. | 525/98 |
| 4,554,304 | 11/1985 | Hansen et al. | 524/488 |
| 4,857,594 | 8/1989 | Lakshmans et al. | 525/98 |

FOREIGN PATENT DOCUMENTS

| | | |
|---|---|---|
| 47056/85 | 4/1985 | Austria . |
| 58-23865 | 2/1983 | Japan . |
| 60-120775 | 6/1985 | Japan . |
| 62-53386 | 3/1987 | Japan . |

*Primary Examiner*—Carman J. Seccuro
*Attorney, Agent, or Firm*—Gary L. Griswold; Walter N. Kirn; Robert H. Jordan

[57] ABSTRACT

A hot melt adhesive consisting essentially of amorphous polypropylene, styrene-based themoplastic elastomer, tackifier and wax having a dissipation factor of about 0.010 or less at 1 kilohertz at 23° C., and a volume resistivity of at least about $1 \times 10^{14}$ ohm-cm at 23° C. Such adhesives exhibit good shear strength and shock resistance.

17 Claims, 3 Drawing Sheets

AMORPHOUS-POLYPROPYLENE-BASED HOT MELT ADHESIVE

This is a continuation of application Ser. No. 175,933, filed Mar. 31, 1988, now abandoned.

FIELD OF INVENTION

The present invention relates to a composition useful as a hot melt adhesive. The present invention specifically relates to an amorphous-polypropylene-based hot melt adhesive.

BACKGROUND

A hot melt adhesive typically melts sharply upon heating and flows substantially freely for application to adherends which are being bonded. Upon cooling the adhesive hardens forming the desired bond.

Hot melt adhesives have been formulated for a variety of applications, including, for example, such applications as bonding papers, wood, textiles, and corrugated paperboard. Typical adhesive compositions often contain tackifying resins and oils or waxes to, for instance, modify the viscosity of the composition or improve its adhesion to substrates. In some instances, a second polymer or elastomer may be added to modify certain properties of the adhesive.

For use in bonding such articles as machine parts and electronic components, which may be made with a variety of materials including metals and plastics, an adhesive should provide a bond having sufficient thermal and mechanical shock resistance, and shear strength. In the case of electronic or electrical components, an adhesive, in order to be suitable for such uses as attaching electronic elements to a circuit board, should provide the desired electrical properties as defined by the application, e.g., low tendency to degrade the other materials of the components, high degree of resistivity, etc., as well as have a melting point such that the composition may be applied at temperatures low enough so as to not damage the other elements of the electronic component yet such that the bond will not be broken by the temperature required for other processes to which the component is subjected during fabrication and subsequent use.

Japan Kokai No. 60-120775 (Inaba et al.) discloses a hot melt adhesive comprising ethylene/propylene copolymer, atactic polypropylene, tackifier, and thermoplastic elastomer such as styrene-butadiene-styrene as a filler. Such compositions typically do not provide sufficient creep resistance, particularly under elevated temperatures. Furthermore, the electrical characteristics of such compositions may not be within ranges typically desired for use in electronic components.

Japan Kokai No. 58-23865 (Okude et al.) discloses hot melt adhesives toughened with particles of vulcanized rubber (5 to 200 mesh) to improve the elasticity of the adhesive and the bonds provided therewith. Adhesive compositions of the type disclosed in the reference typically do not achieve the degree of thermal and/or mechanical shock resistance, and shear strengths, particularly at low temperatures, that may be desired.

SUMMARY OF INVENTION

The present invention provides a novel composition useful as a hot melt adhesive, and articles fabricated therewith. The hot melt adhesives provided by the invention are suitable for many applications wherein a strong shock resistant, thermally stable bond is desired. Typical applications include such uses as bonding electronic components or machine parts.

In brief summary, the composition of the invention typically consists essentially of the following: (a) amorphous polypropylene; (b) styrene-based thermoplastic elastomer (as defined hereinafter); (c) tackifier; and (d) wax; wherein said composition has a dissipation factor of about 0.010 or less at 1 kilohertz at 23° C., and a volume resistivity of at least about $1 \times 10^{14}$ ohm-cm at 23° C.

Such adhesives are particularly useful for bonding electronic components because they typically provide high peel strength, high low-temperature shear strength, excellent thermal shock resistance, high resistance to creep at elevated temperatures, and high mechanical shock resistance, especially at low temperatures, e.g., $-40°$ C., and because they are substantially non-corrosive to copper. Further, such adhesives will effectively wet a variety of adherends, thereby providing effective adhesion thereto. Moreover, such adhesives may be used to form bonds that will resist such elevated temperatures as may typically be encountered during the fabrication of electronic components and their use, and yet provide good low temperature properties as described herein. Thus the hot melt adhesive compositions disclosed herein provide desired bond characteristics over a useful range of temperatures.

BRIEF DESCRIPTION OF DRAWING

The invention will be further explained with reference to the drawing, wherein.

Figure 1:
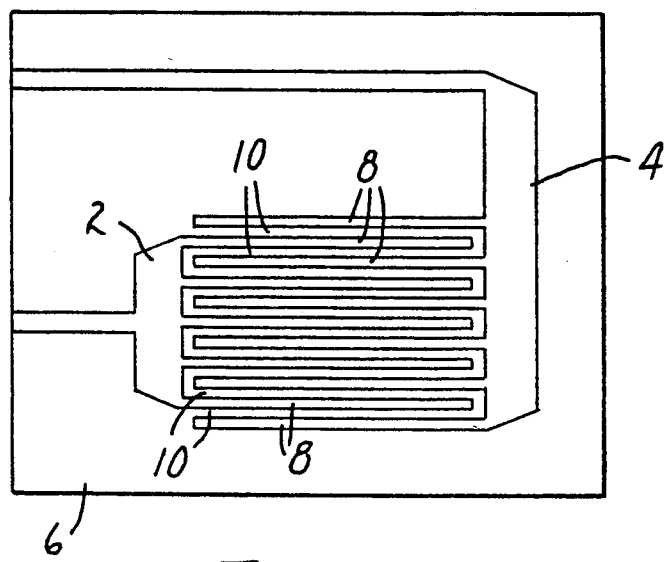
FIG. 1 is a schematic view of a test electrode of the type used in the Electrolytic Corrosion test discussed in the Examples.

These Figures are intended to be merely illustrative and are not limiting.

DETAILED DESCRIPTION OF INVENTION

As described above, the hot melt adhesive of the invention is a composition typically consisting essentially of the following: (a) amorphous polypropylene; (b) styrene-based thermoplastic elastomer (as hereinafter defined); (c) tackifier; and (d) wax; wherein said composition has a dissipation factor of about 0.010 or less at 1 kilohertz at 23° C., and a volume resistivity of at least about $1 \times 10^{14}$ ohm-cm at 23° C.

Adhesive compositions formulated according to the invention will typically also have a volume resistivity between about $10^{14}$ and about $10^{17}$ ohm-centimeter at 23° C., dielectric strength between about 25 and about 50 kilovolts/millimeter, dielectric constant between about 2.3 and about 3.0 at 1 kilohertz, dielectric lost tangent (or dissipation factor) between about 0.0008 and about 0.010 at 1 kilohertz at 23° C., and electrolytic corrosion after 1000 hours of between about $10^{10}$ and about $10^{12}$ ohm.

An example of amorphous polypropylene which may be used in the composition of the invention is atactic polypropylene, preferably having a weight average molecular weight between about 10,000 and about 100,000, and more preferably between about 10,000 and about 50,000. At substantially lower molecular weights, the resultant adhesive composition may tend to have poorer physical properties, e.g., lower strengths and resistance to shock. At substantially higher molecular weights, the viscosity of the composition may tend to be too high for convenient processing and handling during production of the adhesive.

Atactic polypropylene is essentially a non-crystalline, i.e., amorphous, form of polypropylene formed in comparatively small amounts during the production of isotactic polypropylene, a more crystalline form of polypropylene, by stereospecific polymerization of propylene. Examples of commercially available amorphous polypropylene resins which are suitable for use in the invention include the following: EASTOBOND Series M-5W, M-500, and G-92, available from Eastman Chemical Products, Inc.; POLYTAC R Series, SUPERTAC., and POLYMER C polypropylenes, available from Crowley Chemical Company; and A-FAX 500, 600, 800, and 940 Polypropylenes, available from Hercules Inc.

Another example of amorphous polypropylene suitable for use in compositions of the invention is propylene copolymerized with low molecular weight alkenes, e.g., ethylene or 1-butene, such as Amorphous Poly Alpha Olefin commercially available from El Paso Products Company.

Adhesive compositions of the invention preferably contain between about 10 and about 70 weight percent, and more preferably between about 14 and about 50 weight percent, of amorphous polypropylene. At substantially higher levels of amorphous polypropylene, the resultant composition may tend to be too soft and have lower strengths, whereas at substantially lower levels of amorphous polypropylene, the resultant composition may tend to be too brittle. The polypropylene component of such adhesive compositions may include minor amounts, typically about 10 weight percent thereof or less, preferably less than about 2 weight percent, of other forms of polypropylene, e.g., isotactic or syndiotactic polypropylenes, which tend to be more crystalline in nature. Higher amounts of such forms of polypropylene may tend to impart a more crystalline nature to the resultant adhesive composition, thereby rendering same more brittle and less useful as hot melt adhesive.

Adhesive compositions of the invention further contain a styrene-based thermoplastic elastomer. The styrene-based thermoplastic elastomer comprises blocks of hard segments, e.g. polystyrene, and blocks of soft segments, e.g., polyisoprene, polybutadiene, poly(ethylene-propylene), poly(ethylene-butylene), and polypropylene. Thus, useful styrene-based elastomers may comprise, for example, blocks of polystyrene and blocks of polyisoprene, or blocks of polystyrene and blocks of polybutadiene, or blocks of polystyrene and blocks of poly(ethylene-butadiene). The soft segments of the styrene-based elastomer are preferably substantially saturated, e.g., such polymers as poly(ethylene-propylene), poly(ethylene-butylene), because it has been found that adhesive compositions of the invention in which the styrene-based thermoplastic elastomers comprise such segments tend to have better resistance to oxidative degradation when heated. The styrene-based elastomers are preferably styrene-terminated because such block copolymers tend to have higher elasticity.

The polystyrene blocks, sometimes referred to herein as A blocks, preferably have weight average molecular weights between about 5,000 and about 125,000, and more preferably between about 8,000 and about 45,000. Adhesive compositions wherein the A blocks have molecular weights substantially higher than this range may tend to be have higher viscosity than desired for convenient handling, whereas those comprising A blocks having substantially lower molecular weights may tend to be too brittle. The blocks of the soft segments, sometimes referred to herein as B blocks, preferably have weight average molecular weights between about 30,000 and about 125,000, and more preferably between about 50,000 and about 100,000.

Preferably the styrene-based thermoplastic elastomer comprises a weight ratio of A to B blocks of between about 1:4 and 4:1. Adhesive compositions wherein the weight ratio is substantially lower than about 1:4 may tend to be excessively soft such that bonds provided therewith have less strength, whereas those compositions comprising styrene-based thermoplastic elastomers wherein the weight ratio is substantially higher than about 4:1 may tend to be more brittle.

Examples of styrene-based thermoplastic elastomers that are useful in the present invention and which are commercially available from Shell Chemical Company include styrene-ethylene-butylene-styrene block copolymers, e.g., KRATON G-1650, G-1652, and G-1657; styrene-butadiene-styrene block copolymers, e.g., KRATON D-1101 and D-1102; styrene-isoprene-styrene block copolymer, e.g., KRATON D-1107, D-1111, D-1112, and D-1117; styrene-ethylene-propylene block copolymer, e.g., KRATON G-1701 and G-1702; styrene-isoprene block copolymer, e.g., KRATON D-1320; and styrene-butadiene block copolymer, e.g., KRATON D-1118. Blends or mixtures of such block copolymers, e.g., KRATON G-1726X, a blend of styrene-ethylene-butylene-styrene block copolymer and styrene-ethylene-butadiene block copolymer, also commercially available from Shell Chemical Company, are also useful in adhesive compositions of the invention. The G-series KRATONS, which are substantially saturated, are, for that reason, typically preferred for use in compositions of the invention over the D-series KRATONS which are not saturated.

Examples of other commercially available styrene-based thermoplastic elastomers that are suitable for use in the present invention include QUINTAC 3420, 3430, and 3435, available from Japanese Zeon Co., Ltd., and SIS-5000, available from Japan Synthetic Rubber Co., Ltd. (styrene-isoprene-styrene block copolymers); and SOLPRENE T-411, T-414, and T-475, available from Phillips Petroleum Co., TUFPRENE A and ASAPRENE T-431, available from Asahi Chemical Industry Company Co., Ltd., and TR-1000, and TR-2000, available from Japan Synthetic Rubber Co., Ltd. (styrene-butadiene-styrene block copolymers).

Adhesive compositions of the invention typically contain between about 2 and about 70, and preferably contain between about 2 and about 60, weight percent of styrene-based thermoplastic elastomer, depending upon the specific properties desired of the resultant composition. Adhesive compositions comprising lesser amounts of styrene-based elastomer, while typically tending to have higher shock resistance and shear strength, may tend to have poorer thermal shock resistance and mechanical properties, whereas compositions comprising greater proportions of styrene-based elastomer may tend to have higher viscosity and lower ability to wet the substrate, thereby resulting in greater difficulty during handling and use.

The amorphous polypropylene component and styrene-based elastomer component of adhesive compositions of the invention tend to be immiscible such that mixtures thereof form discrete domains or distinct phases. While we do not wish to be bound be this theory, it is believed that the exceptional shock resistance and cold temperature properties of adhesives of the invention are due, at least in part, to such phase-separation structure whereby stresses upon the adhesive bond are more effectively internally absorbed at the finely dispersed styrene-based elastomer phase without failure of the bond.

The phase-separation structure can be readily observed by adding ruthenium tetroxide dye to such composition and examination by means of a transmission-type electron microscope. Under such conditions, the polystyrene blocks of the styrene-based elastomer and amorphous polypropylene phase will appear dark whereas the soft segments of the styrene-based elastomer appear lighter.

Figure 2:
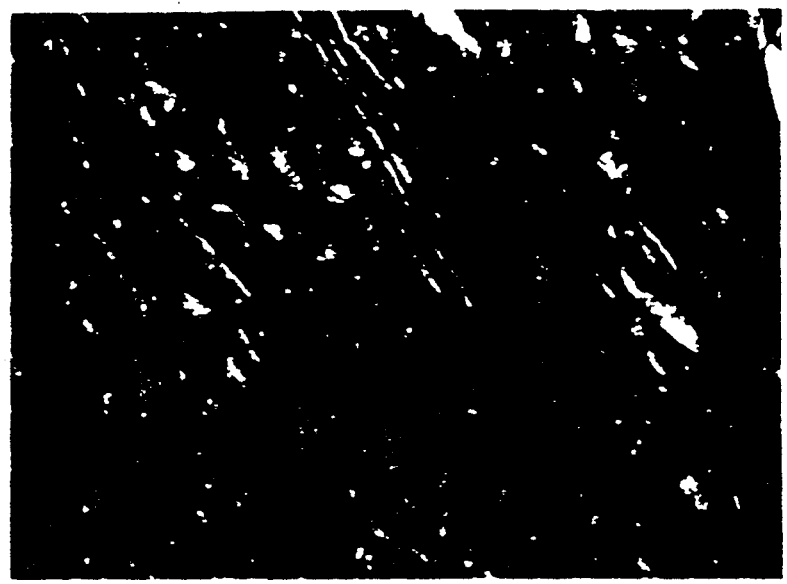
FIGS. 2-5 are photomicrographs of adhesive compositions of the invention taken with a transmission-type electron microscope illustrating the discrete domains formed therein.
Figure 3:
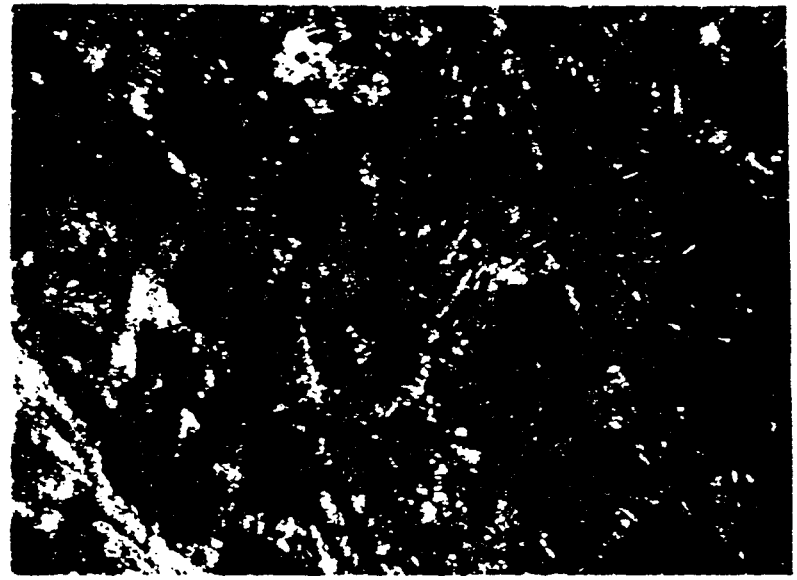
Figure 4:
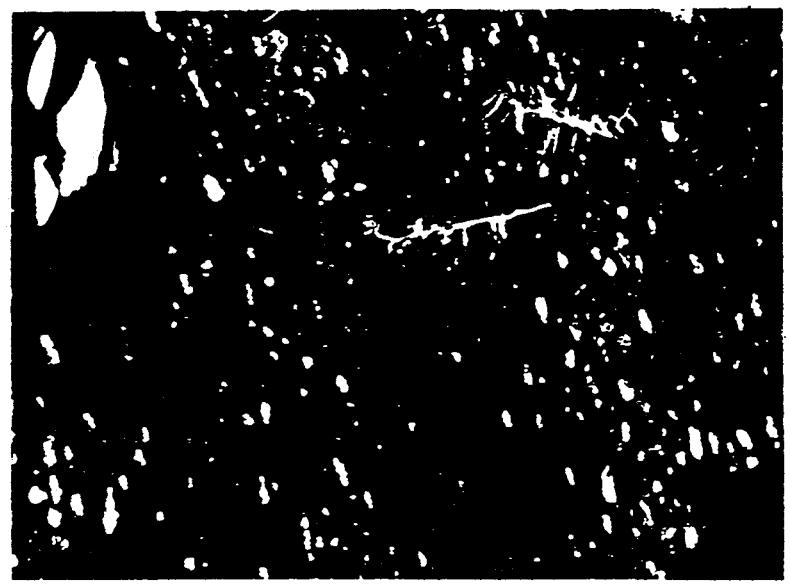
Figure 5:

This phase-separation or discrete domain structure may be observed in FIGS. 2-5 which are photomicrographs of compositions of the invention taken with a transmission-type electron microscope. FIG. 2 is a 10,000 time enlarged view of the adhesive composition prepared in Example 45 and FIG. 3 is a 30,000 time enlarged view of the same composition. FIG. 4 is 3,000 time enlarged view of the adhesive composition prepared in Example 46 and FIG. 5 is a 10,000 time enlarged view of the same composition.

Adhesive compositions of the invention further typically contain one or more tackifiers. Such tackifier should be compatible with the amorphous polypropylene, i.e., should not separate upon standing in liquid or molten form, and is preferably highly oxidatively stable. Among the naturally-occurring resins which may be used are polyterpenes, rosins, rosin esters and derivatives thereof, of which the more fully hydrogenated forms thereof tend to be preferred because of the light color and high oxidative stability they typically tend to impart to the composition. Five and nine carbon hydrocarbon resins, preferably those which are substantially free of hydrophilic functional groups, may be used as tackifiers. Various synthetically-produced tackifying resins may also be employed, examples of which include aliphatic and aromatic resins, with the fully hydrogenated forms thereof again being preferred. Examples of other resins which may be used include modified terpenes, coumarone-indenes, polyesters, alkyl phenols, and styrene oligomers. Mixtures of the aforedescribed tackifiers may also be used.

The tackifier is present in effective amount, typically not exceeding the proportion of amorphous polypropylene in the composition, to lower the melt viscosity of the composition and improve its ability to wet out the substrate, thereby improving adhesion to the substrate. Thus, adhesive compositions of the invention typically contain at least about 1 weight percent and may contain up to about 35 weight percent of tackifier.

Adhesive compositions of the invention typically also contain up to about 24, most typically between about 2 and about 20, weight percent of one or more waxes, which may be included therein, for example, to improve the set times of the adhesive composition, alter its viscosity to improve the handling characteristics thereof, and/or increase the hardness of the bond provided therewith. Well-known waxes used in hot melt adhesives, such as low molecular weight polyethylene, microcrystalline wax, Fischer-Tropsch wax, synthetic hydrocarbon wax, and paraffin wax, are examples of suitable waxes for use in the present invention.

Adhesive compositions of the invention may also further contain one or more other agents depending upon the properties desired thereof for a particular application. Examples of some of such agents or additives include minor amounts of crystalline polyolefins, e.g., crystalline polypropylene or polyethylene, to shorten the set time of the embodiment of the invention, fillers, e.g., fumed silica, talc, clay, glass microspheres, plastic microbubbles, etc., colorants, e.g., titanium dioxide, antioxidants, and stabilizers.

Preparation of the adhesive composition by mixing the components and desired additives as described above may be done in conventional manner whereby the components can be completely mixed to ensure that a substantially uniform blend is achieved. The compatibility of the amorphous polypropylene and styrene-based elastomer components is typically such that mixing and dispersion of the components is preferably done by such known techniques as high shear mixing so that the particles of styrene-based thermoplastic elastomer phase and those of amorphous polypropylene phase are reduced to about 100 microns or less, more preferably to about 50 microns or less, and ideally to about 10 microns or less, in order to ensure that a substantially uniform and homogeneous composition results. Thus, the amorphous polypropylene and styrene-based thermoplastic elastomer, which are typically substantially viscous materials, are preferably first added to the mixing vessel and mixed with a high shear technique to ensure that effective mixing is achieved and that agglomerates or globules of such components will be broken up. Typically, the components are continuously mixed at a sufficiently high temperature for the mixture to be in a molten state until a homogeneous mixture is attained.

EXAMPLES

The invention will now be further explained with the following illustrative examples. All amounts are expressed in parts by weight unless otherwise indicated.

The following abbreviations are sometimes used herein:

| Abbreviation | Meaning |
| --- | --- |
| ASTM | American Standards of Testing Materials |
| JIS | Japanese Industrial Standard |
| mPa | milli-Pascal |
| cm | centimeter |
| mm | millimeter |

Unless otherwise indicated, the test procedures referred to in the examples were performed as follows.

Ring and Ball Softening Point

Ring and Ball Softening Point, referred to herein as "R&B", was determined according to ASTM E-28.

Congealing Point

Congealing Point, referred to herein as "CP", was determined according to ASTM D-938.

Vicat Softening Point

Vicat Softening Point, referred to herein as "Vicat", was determined according to ASTM D-1525.

Viscosity

Viscosity was determined at 180° C. using a Brookfield RVT and #27 spindle at 20 rpm in accordance with ASTM D-4402.

Deadload Heat Resistance

Deadload Heat Resistance is the temperature at which a 2.54 centimeter by 2.54 centimeter bond of Douglas Fir to Douglas Fir will support a 200 gram load in static shear for 30 minutes. Averages for three specimens were taken.

Overlap Shear Strength

Overlap Shear Strength, herein referred to as "OLS", was determined using clean, dry test strips with an overlap bond 2.54 centimeters wide having a bondline thickness of about 0.33 millimeters tested with an Instron Tester at a crosshead speed of about 5.1 centimeters/minute. Unless otherwise indicated, results are reported as kilograms-force/centimeter,

Tension Loading Shear Strength

Tension Loading Shear Strength, herein referred to as "TLS", was determined according to ASTM D-3164 and D-1002 (same procedure as JIS K 6850) at a tension rate of 50 millimeters/minute.

Impact Shear Strength

Impact Shear Strength was determined according to ASTM D-950 (same procedure as JIS K 6855) using 12.5 millimeter wide Birch wood. Unless otherwise indicated, results are reported as (kilograms-force)(centimeter)/centimeter$^2$,

Thermal Shock Cycle

Thermal Shock Cycle was determined by bonding several electronic components (0.6 centimeter diameter axial capacitors) onto epoxy glass boards with the adhesive composition being tested, substantially embedding the electronic components in the adhesive composition, and exposing the specimens to up to 40 cold and hot cycles. Each cycle comprised immersion for about 5 minutes in 3M FLUORINERT Brand Liquid FC-77 at a temperature of about −40° C., followed by immersion for about 5 minutes in 3M FLUORINERT Brand Liquid FC−40 at a temperature of about 90° C. The number of failed specimens, i.e., those which separated from or fell off the epoxy glass boards, was noted and reported as percentage of failures.

Volume Resistivity

Volume Resistivity, referred to herein as resistivity, was determined at 23° C. according to ASTM D-257 (same test procedure as JIS K 6911).

Dielectric Strength

Dielectric strength was determined at 23° C. according to ASTM D-149 (same test procedure as JIS K 6911).

Dielectric Constant

Dielectric constant was determined at 23° C. and 1 kilohertz according to ASTM D-150 (same test procedure as JIS K 6911).

Dissipation Factor

Dissipation factor was determined at 23° C. and 1 kilohertz in accordance with ASTM D-150 (same procedure as JIS K 6911).

Electrolytic Corrosion

Electric Corrosion was determined by embedding a comb electrode having about a 0.8 millimeter circuit width and about a 0.8 millimeter spacing in a 1 millimeter thick coating of the adhesive being tested on a glass epoxy board without solder resist. The specimen was exposed to 95% relative humidity at 60° C. while causing a 100 volt DC potential between the electrodes for the indicated period. After causing a 500 volt DC. potential for 1 minute between the electrodes, insulation resistance was measured at 23° C. A schematic view of the test electrode is illustrated in FIG. 1 wherein is shown circuit members 2 and 4 with protruding members 8 that are arrayed in spaced fashion separated by spacings 10. During the test, opposing voltage potentials will be applied to circuit members 2 and 4, e.g., positive and negative, respectively.

180° Peel Strength

180° Peel Strength was determined according to JIS K 6854 at a tension rate of 50 millimeters/minute. This test method provided a minimum value of 2.0 kilograms/25 mm-width.

EXAMPLE 1

Example 1 illustrates an embodiment of the invention.

To a clean, steel can on a hot plate, the following components:

| Component | Amount |
| --- | --- |
| EASTOBOND G-92 - atactic polypropylene having a R&B of about 145° C., available from Eastman Chemical Products, Inc. | 35.64 |
| ARKON P-125 - petroleum resin having a R&B of about 125° C., as tackifier. | 24.75 |
| PARAFLINT H-1 - Fischer-Tropsch Wax having a CP of about 95° C., available from Moore & Munger, Inc. | 9.9 |
| ALLIED AC-617 - low molec. wt. polyethylene having a R&B of about 102° C., available from Allied Chemical. | 9.9 |
| TENITE 625 - crystalline polypropylene having a Vicat between about 58° and 85° C., available from Eastman Chemical Products. | 3.96 |
| IRGANOX 1010 - tetrakis[methylene-3-(3',5'-di-t-butyl-4'-hydroxyphenyl)propionate]methane, available from Ciba-Geigy Corp., as antioxidant | 0.9 | were added and heated to about 194° C. After the contents had become fluid, slow stirring was begun using a 5 centimeter diameter Cowles blade driven by an air mixer. When the mixture had become homogeneous, 14.85 parts of KRATON G-1657, styrene-ethylene-butylene-styrene block copolymer having a specific gravity of about 0.90 was added while stirring. The mixture was then heated to about 205° C. and the mixing speed raised to about 1500 rpm. These conditions were maintained for between about 45 and 90 minutes until the mixture had attained a smooth, uniform appearance. The mixture was then cast into rods and cooled. The resultant hot melt adhesive was then tested. The results were as follows.

| Property | Result |
| --- | --- |
| R&B | 149° C. |
| Viscosity (mPa) | 6125 |
| Deadload Heat Resis. | 180° C. |
| Therm. Shock Cyc. (failures) | 0.0% |
| OLS at 25° C. | |
| Douglas Fir to same | 15.5 |
| Polyethylene to same | 17.2 |
| FR-4* to same | 18.7 |
| Volume Resistivity ($\times 10^{17}$ ohm-cm) | 6.7 |
| Dielectric Strength (kilovolt/mm) | 51 |
| Dielectric Constant | 2.3 |
| Dissipation Factor | 0.0010 |

*FR-4 is a glass reinforced epoxy circuit board

These results illustrate the excellent adhesive and electrical properties provided by an adhesive composition of the invention.

EXAMPLE 2 AND COMPARATIVE EXAMPLE A

Example 2 and Comparative Example A were prepared using the following components:

| Component | Ex. 2 | Comp. Ex. A |
| --- | --- | --- |
| EASTOBOND G-92 | 40.8 | 48 |
| ARKON P-125 | 25.4 | 30 |
| PARAFLINT H-1 | 9.4 | 11 |
| ALLIED AC-617 | 9.4 | 11 |
| KRATON G-1657 | 15.0 | — |

The respective mixtures were prepared by placing the aforementioned components in a clean steel container and heating. When the components were nearly molten, stirring was initiated using a 4 centimeter sigma blade and the temperature raised to about 180° C. Each mixture was then continuously stirred at 2000 rpm, and the temperature raised to about 200° C. until the mixtures were each homogeneous.

The respective mixtures were then cast into rods and cooled. The resultant hotmelt adhesives were then tested. The results for each composition are tabulated in Table I.

TABLE I

| Property | Ex. 2 | Comp. Ex. A |
| --- | --- | --- |
| Viscosity (mPa) | 6680 | 990 |
| Impact Shear Strength | | |
| at 4° C. | 5.0 | 1.0 |
| at 25° C. | 17.9 | 1.2 |
| Therm. Shock Cyc. (% failure) | | |
| after 3 cycles | 0 | 90 |
| after 6 cycles | 0 | 90 |
| after 30 cycles | 0 | 100 |
| Volume Resistivity ($\times 10^{17}$ ohm-cm) | 2.0 | 3.5 |
| Dielectric Strength (kilovolt/mm) | 28 | 40 |
| Dielectric Constant (at 1 kilohertz) | 2.4 | 2.3 |
| Dissipation Factor | 0.0015 | 0.0010 |
| Electrolytic Corrosion ($\times 10^{10}$ ohm) | | |
| initial | 7000 | 7000 |
| after 500 hours | 60 | 6 |
| after 1000 hours | 50 | 3 |
| Adhesion Properties | | |
| OLS at 25° C. (kilograms/cm$^2$) | 18.3 | 8.8 |
| Polyvinyl chloride to same | | |

TABLE I-continued

| Property | Ex. 2 | Comp. Ex. A |
| --- | --- | --- |
| TLS at 0° C. (kilograms/cm$^2$) | 27.5 | 5.1 |
| Polypropylene to same | | |
| Polyethylene to same | 17.6 | 2.6 |
| Polyacetal to same | 11.6 | 1.6 |
| Polyvinyl chloride to same | 17.0 | 2.5 |
| Nylon-6 to same | 12.7 | 1.8 |
| Nylon-6.6 to same | 24.0 | 1.9 |
| Polybutylene terephthalate to same | 13.0 | 2.1 |
| Polyphenylene oxide to same | 17.7 | 3.1 |
| Polycarbonate to same | 16.8 | 2.2 |
| Acrylonitrile-butadiene-styrene to same | 21.3 | 4.1 |
| Epoxy glass to same | 24.5 | 8.7 |
| Phenolic resin to same | 20.2 | 5.5 |
| Birch wood to same | 54.9 | 18.9 |
| 180° Peel at 25° C. (kilograms/25 mm-width) | | |
| Polypropylene to canvas | 13.0 | 4.5 |
| Polyethylene to canvas | 15.0 | 4.5 |
| Polyacetal to canvas | 9.0 | 3.5 |
| Nylon-6 to canvas | 12.5 | 4.0 |
| Nylon-6.6 to canvas | 16.0 | 4.5 |
| Polybutylene terephthalate to canvas | 12.0 | 4.0 |
| Polyphenylene oxide to canvas | 9.5 | 2.0 |
| Polycarbonate to canvas | 11.0 | 3.0 |
| Acrylonitrile-butadiene-styrene to canvas | 10.5 | 1.0 |
| Epoxy glass to canvas | 14.5 | 2.0 |
| Phenolic resin to canvas | 13.0 | 2.0 |
| Birch wood to canvas | 14.0 | 4.0 |
| 180° Peel at 0° C. (kilograms/25 mm-width) | | |
| Polypropylene to canvas | 7.0 | 2.0 |
| Polyethylene to canvas | 6.0 | 2.5 |
| Polyacetal to canvas | 5.0 | 2.0 |
| Nylon-6 to canvas | 6.5 | 2.0 |
| Nylon-6.6 to canvas | 6.5 | 2.0 |
| Polybutylene terephthalate to canvas | 6.0 | 2.0 |
| Polyphenylene oxide to canvas | 3.5 | 2.0 |
| Polycarbonate to canvas | 5.5 | 2.0 |
| Acrylonitrile-butadiene-styrene to canvas | 3.5 | 2.0 |
| Epoxy glass to canvas | 6.5 | 2.0 |
| Phenolic resin to canvas | 5.0 | 2.0 |
| Birch wood to canvas | 6.0 | 2.0 |

Example 2 and Comparative Example A illustrate the excellent adhesion, corrosion resistance, and thermal shock resistance properties of an adhesive composition of the invention, and illustrate the improvement of those properties in a hot melt adhesive composition which comprises a styrene-based elastomer in accordance with the invention.

EXAMPLES 3-10

Examples 3-10 illustrate the use of varying amounts of styrene-isoprene-styrene block copolymer in adhesive compositions of the invention.

The compositions in Examples 3-6 were made as in Example 2. In Examples 7-10, due to the higher viscosity of the mixtures, the styrene-isoprene-styrene block copolymer, amorphous polypropylene, and tackifying resin were first melted and mixed with a sigma-type kneader at about 180° C. and then mixed with the other components as in Examples 3-6.

The compositions of the adhesives made in these Examples and the properties thereof are tabulated in Table II.

TABLE II

| Component | Com. Ex. A. | 3 | 4 | 5 | 6 | 7 | 8 | 9 | 10 |
|---|---|---|---|---|---|---|---|---|---|
| EASTOBOND G-92 | 48 | 47.0 | 45.7 | 43.2 | 40.8 | 38.4 | 33.7 | 24.1 | 14.5 |
| ARKON P-125 | 29.4 | 30 | 28.5 | 27.0 | 25.4 | 24.0 | 20.9 | 14.9 | 8.9 |
| PARAFLINT H-1 | 11 | 10.8 | 10.4 | 9.9 | 9.4 | 8.8 | 7.7 | 5.5 | 3.3 |
| ALLIED AC-617 | 11 | 10.8 | 10.4 | 9.9 | 9.4 | 8.8 | 7.7 | 5.5 | 3.3 |
| KRATON D-1107 | — | 2.0 | 5.0 | 10.0 | 15.0 | 20.0 | 30.0 | 50.0 | 70.0 |
| Property | | | | | | | | | |
| Viscosity (mPa) | 990 | 1030 | 1130 | 1290 | 2130 | 2210 | 4430 | 25,000 | >500,000 |
| Impact Shear Strength | | | | | | | | | |
| at 4 C. | 1.0 | 1.4 | 1.4 | 1.8 | 2.6 | 3.1 | 3.4 | 11.7 | 13.0 |
| at 25 C. | 1.2 | 1.7 | 2.0 | 2.4 | 5.8 | 4.3 | 5.6 | 14.0 | 16.0 |
| TLS Strength | | | | | | | | | |
| at 0 C. | 2.5 | 3.8 | 4.7 | 4.2 | 5.3 | 8.8 | 9.0 | 11.1 | 5.6 |
| at 25 C. | 8.8 | 14.4 | 18.1 | 8.3 | 13.4 | 6.2 | 3.0 | 3.9 | 1.7 |

These results show the use of a styrene-isoprene-styrene block copolymer at between about 2 and about 70 weight percent in an adhesive composition of the invention, to provide improved impact strength and, particularly at low temperatures, improved tension loading shear strength.

EXAMPLES 11-17

Examples 11-17 illustrate the use of varying amounts of styrene-ethylene-butylene-styrene block copolymer in adhesive compositions of the invention.

The compositions in Examples 11-14 and 15-17 were made as in Examples 3-6 and 7-10, respectively. The compositions of the adhesives made these Examples and the properties thereof are tabulated in Table III.

TABLE III

| Component | Com. Ex. A. | 11 | 12 | 13 | 14 | 15 | 16 | 17 |
|---|---|---|---|---|---|---|---|---|
| EASTOBOND G-92 | 48 | 47.0 | 45.7 | 43.2 | 40.8 | 38.4 | 33.7 | 24.1 |
| ARKON P-125 | 29.4 | 30 | 28.5 | 27.0 | 25.4 | 24.0 | 20.9 | 14.9 |
| PARAFLINT H-1 | 11 | 10.8 | 10.4 | 9.9 | 9.4 | 8.8 | 7.7 | 5.5 |
| ALLIED AC-617 | 11 | 10.8 | 10.4 | 9.9 | 9.4 | 8.8 | 7.7 | 5.5 |
| KRATON D-1652 | — | 2.0 | 5.0 | 10.0 | 15.0 | 20.0 | 30.0 | 50.0 |
| Property | | | | | | | | |
| Viscosity (mPa) | 990 | 1210 | 1720 | 3220 | 7380 | 20,000 | 210,000 | >500,000 |
| Impact Shear Strength | | | | | | | | |
| at 4 C. | 1.0 | 1.2 | 1.3 | 1.4 | 2.2 | 2.7 | 8.7 | 8.4 |
| at 25 C. | 1.2 | 1.4 | 2.0 | 2.1 | 6.5 | 7.3 | 10.7 | 10.2 |
| TLS Strength | | | | | | | | |
| at 0 C. | 2.5 | 3.2 | 4.0 | 6.3 | 6.4 | 7.9 | 18.6 | 13.0 |
| at 25 C. | 8.8 | 16.6 | 20.7 | 24.4 | 23.7 | 22.6 | 16.5 | 10.0 |

These results show the use of a styrene-ethylene-butylene-styrene block copolymer at between about 2 and 50 weight percent in an adhesive composition of the invention to provide improved impact strength and, particularly at low temperatures, improved tension loading shear strength.

EXAMPLES 18-24

Examples 18-24 illustrate the use of varying amounts of SEP block copolymer in adhesive compositions of the invention.

The compositions in Examples 18-21 and 22-24 were made as in Examples 3-6 and 7-10, respectively. The compositions of the adhesives made in these Examples and the properties thereof are tabulated in Table IV.

TABLE IV

| Component | Com. Ex. A. | 18 | 19 | 20 | 21 | 22 | 23 | 24 |
|---|---|---|---|---|---|---|---|---|
| EASTOBOND G-92 | 48 | 47.0 | 45.7 | 43.2 | 40.8 | 38.4 | 33.7 | 24.1 |
| ARKON P-125 | 29.4 | 30 | 28.5 | 27.0 | 25.4 | 24.0 | 20.9 | 14.9 |
| PARAFLINT H-1 | 11 | 10.8 | 10.4 | 9.9 | 9.4 | 8.8 | 7.7 | 5.5 |
| ALLIED AC-617 | 11 | 10.8 | 10.4 | 9.9 | 9.4 | 8.8 | 7.7 | 5.5 |
| KRATON G-1702 | — | 2.0 | 5.0 | 10.0 | 15.0 | 20.0 | 30.0 | 50.0 |
| Property | | | | | | | | |
| Viscosity (mPa) | 990 | 1430 | 2400 | 7130 | 122,500 | >500,000 | | |
| Impact Shear Strength | | | | | | | | |
| at 4° C. | 1.0 | 1.2 | 1.4 | 1.5 | 1.8 | 18.6 | 18.6 | 12.4 |
| at 25° C. | 1.2 | 1.5 | 1.6 | 11.9 | 16.0 | 13.6 | 14.1 | 11.7 |
| TLS Strength | | | | | | | | |
| at 0° C. | 2.5 | 3.3 | 5.1 | 5.0 | 7.2 | 25.1 | 26.6 | 13.7 |
| at 25° C. | 8.8 | 17.0 | 26.9 | 24.5 | 20.0 | 16.9 | 11.8 | 6.7 |

These results show the use of a styrene-ethylene-propylene block copolymer at between about 2 and 50 weight percent in an adhesive composition of the invention to provide improved impact strength and, at low temperatures, improved tension loading shear strength.

EXAMPLES 25-28

Examples 25-28 illustrate the use of other styrene-based thermoplastic elastomers in adhesive compositions of the invention.

The compositions were made as in Examples 7-10 except that the indicated amounts of the indicated block copolymers were used in place of styrene-isoprene-styrene. The compositions of the specimens and the properties thereof are tabulated in Table V.

TABLE V

| Component | Example | | | |
| --- | --- | --- | --- | --- |
| | 25 | 26 | 27 | 28 |
| EASTOBOND G-92 | 33.7 | 38.4 | 38.4 | 38.4 |
| ARKON P-125 | 20.9 | 24.0 | 24.0 | 24.0 |
| PARAFLINT H-1 | 7.7 | 8.8 | 8.8 | 8.8 |
| ALLIED AC-617 | 7.7 | 8.8 | 8.8 | 8.8 |
| KRATON D-1102 | 30 | — | — | — |
| KRATON D-1320 | — | 20 | — | — |
| KRATON D-1184 | — | — | 20 | — |
| KRATON D-1118 | — | — | — | 20 |
| Property | | | | |
| Viscosity (mPa) | 8000 | 9150 | 12000 | 3250 |
| Impact Shear Strength | | | | |
| at 4° C. | 2.4 | 1.5 | 1.6 | 1.6 |
| at 25° C. | 2.2 | 2.7 | 2.1 | 2.1 |
| TLS Strength | | | | |
| at 0° C. | 4.4 | 4.2 | 5.8 | 5.6 |
| at 25° C. | 17.8 | 14.7 | 21.3 | 17.6 |

EXAMPLES 29-36

Examples 29-36 illustrate the use of different atactic polypropylenes in adhesive compositions of the invention.

The compositions of these specimens and the properties thereof are tabulated in Table VI.

TABLE VI

| Component | Example | | | | | | | |
| --- | --- | --- | --- | --- | --- | --- | --- | --- |
| | 29 | 30 | 31 | 32 | 33 | 34 | 35 | 36 |
| APP (R&B 115° C.)* | 47.0 | 43.2 | 40.8 | 38.4 | — | — | — | — |
| APP (R&B 138° C.)** | — | — | — | — | 47.0 | 43.2 | 40.8 | 38.4 |
| ARKON P-125 | 29.4 | 27.0 | 25.4 | 24.0 | 29.4 | 27.0 | 25.4 | 24.0 |
| PARAFLINT H-1 | 10.8 | 9.9 | 9.4 | 8.8 | 10.8 | 9.9 | 9.4 | 8.8 |
| ALLIED AC-617 | 10.8 | 9.9 | 9.4 | 8.8 | 10.8 | 9.9 | 9.4 | 8.8 |
| KRATON G-1657 | 2.0 | 10.0 | 15.0 | 20.0 | 2.0 | 10.0 | 15.0 | 20.0 |
| Property | | | | | | | | |
| Viscosity (mPa) | 330 | 1084 | 2580 | 5350 | 850 | 2840 | 5430 | 9410 |
| Impact Shear Strength | | | | | | | | |
| at 4° C. | 1.7 | 2.2 | 3.0 | 15.0 | 2.0 | 2.8 | 4.1 | 16.2 |
| at 25° C. | 3.0 | 14.2 | 14.9 | 16.1 | 2.4 | 12.2 | 17.9 | 18.5 |
| TLS Strength | | | | | | | | |
| at 0° C. | 1.0 | 17.7 | 28.8 | 28.4 | 5.8 | 15.4 | 29.2 | 26.2 |
| at 25° C. | 17.4 | 17.7 | 17.4 | 16.7 | 19.6 | 17.5 | 16.2 | 14.0 |

*Available from Chisso Company.
**Available from Mitsui Toatsu Chemicals, Inc.

EXAMPLES 37-44 AND COMPARATIVE EXAMPLES B-I

Examples 37-44 and respective Comparative Examples B-I illustrate the use of different tackifying resins and waxes in adhesive compositions of the invention.

The compositions were prepared as in Examples 7-10. The compositions and properties of the specimens of these examples are tabulated below.

TABLE VII

| Component | Ex. 37 | Comp. Ex. B |
| --- | --- | --- |
| EASTOBOND G-92 | 40.8 | 48 |
| CLEARON P-125 | 25.4 | 30 |
| PARAFLINT H-1 | 9.4 | 11 |
| ALLIED AC-617 | 9.4 | 11 |
| KRATON G-1657 | 15.0 | — |
| Properties | | |
| Viscosity (mPa) | 5880 | 920 |
| Impact Shear Strength | | |
| at 4° C. | 6.3 | 1.0 |
| at 25° C. | 17.9 | 2.2 |
| TLS Strength | | |
| at 0° C. | 16.4 | 3.7 |
| at 25° C. | 19.7 | 18.2 |

TABLE VIII

| Component | Ex. 38 | Comp. Ex. C |
| --- | --- | --- |
| EASTOBOND G-92 | 40.8 | 48 |
| ARKON P-125 | 25.4 | 30 |
| HI-MIC-2095* | 9.4 | 11 |
| ALLIED AC-617 | 9.4 | 11 |
| KRATON G-1657 | 15.0 | — |
| Properties | | |
| Viscosity (mPa) | 6590 | 950 |
| Impact Shear Strength | | |
| at 4° C. | 11.6 | 1.6 |
| at 25° C. | 18.0 | 2.6 |
| TLS Strength | | |
| at 0° C. | 18.5 | 4.6 |
| at 25° C. | 16.2 | 20.4 |

*Microcrystalline wax having a melting point of 96° C., available from Nippon Seiro Co.

The composition in Comparative Example C was observed to have higher tension loading shear strength than the composition of Example 38 at 25° C., however, the former was also observed to be very brittle whereas the composition of Example 38 was substantially more elastic in nature.

TABLE IX

| Component | Ex. 39 | Comp. Ex. D |
| --- | --- | --- |
| Polypropylene* | 40.8 | 48 |
| HITANOL 1501 | 25.4 | 30 |
| Paraffin Wax 155** | 9.4 | 11 |
| PARAFLINT H-1 | 9.4 | 11 |
| KRATON D-1107 | 15.0 | — |
| Properties | | |
| Viscosity (mPa) | 390 | 75 |
| Impact Shear Strength | | |
| at 4° C. | 2.3 | 0.7 |

TABLE IX-continued

| Component | Ex. 39 | Comp. Ex. D |
|---|---|---|
| at 25° C. | 5.7 | 0.9 |
| TLS Strength | | |
| at 0° C. | 7.7 | 0.5 |
| at 25° C. | 4.6 | 0.4 |

*Atactic polypropylene having a R&B of 115° C., available from Chisso Co.
**Paraffin wax having a melting point of 69° C., available from Nippon Seiro Co.

TABLE X

| Component | Ex. 40 | Comp. Ex. E |
|---|---|---|
| EASTOBOND G-92 | 35.2 | 44 |
| DUREZ RR 12603 | 30.4 | 38 |
| PARAFLINT H-1 | 14.4 | 18 |
| TUFPRENE A | 20.0 | — |
| Properties | | |
| Viscosity (mPa) | 2500 | 2250 |
| Impact Shear Strength | | |
| at 4° C. | 2.6 | 1.7 |
| at 25° C. | 8.1 | 6.1 |
| TLS Strength | | |
| at 0° C. | 26.8 | 23.4 |
| at 25° C. | 15.7 | 13.6 |

TABLE XI

| Component | Ex. 41 | Comp. Ex. F |
|---|---|---|
| Polypropylene* | 35.0 | 43.8 |
| DYMEREX | 15.0 | 18.8 |
| ESTER GUM H | 10.0 | 12.5 |
| Paraffin Wax 155** | 10.0 | 12.5 |
| ALLIED AC-617 | 10.0 | 12.5 |
| KRATON G-1652 | 20.0 | — |
| Properties | | |
| Viscosity (mPa) | 1320 | 90 |
| Impact Shear Strength | | |
| at 4° C. | 17.4 | 0.8 |
| at 25° C. | 10.2 | 4.3 |
| TLS Strength | | |
| at 0° C. | 32.1 | 1.0 |
| at 25° C. | 16.9 | 0.7 |

*Atactic polypropylene having a R&B of 115° C., available from Chisso Co.
**Paraffin wax having a melting point of 69° C., available from Nippon Seiro Co.

TABLE XII

| Component | Ex. 42 | Comp. Ex. G |
|---|---|---|
| EASTOBOND G-92 | 40.8 | 48 |
| CUMARONE-120 | 25.4 | 30 |
| PARAFLINT H-1 | 9.4 | 11 |
| ALLIED AC-617 | 9.4 | 11 |
| KRATON G-1657 | 15.0 | — |
| Properties | | |
| Viscosity (mPa) | 75,000 | 1610 |
| Impact Shear Strength | | |
| at 4° C. | 11.9 | 4.4 |
| at 25° C. | 9.6 | 7.4 |
| TLS Strength | | |
| at 0° C. | 11.7 | 5.5 |
| at 25° C. | 15.3 | 7.9 |

TABLE XIII

| Component | Ex. 43 | Comp. Ex. H |
|---|---|---|
| EASTOBOND G-92 | 40.8 | 48 |
| PICCOLASTIC D-125 | 25.4 | 30 |
| PARAFLINT H-1 | 9.4 | 11 |
| ALLIED AC-617 | 9.4 | 11 |
| KRATON G-1657 | 15.0 | — |
| Properties | | |

TABLE XIII-continued

| Component | Ex. 43 | Comp. Ex. H |
|---|---|---|
| Viscosity (mPa) | 500,000 | 2065 |
| Impact Shear Strength | | |
| at 4° C. | 14.6 | 6.2 |
| at 25° C. | 8.1 | 5.8 |
| TLS Strength | | |
| at 0° C. | 13.7 | 4.7 |
| at 25° C. | 10.1 | 0.2 |

TABLE XIV

| Component | Ex. 44 | Comp. Ex. I |
|---|---|---|
| Polypropylene* | 35.2 | 44 |
| VYLON GX 250 | 30.4 | 38 |
| HI-MIC-2095 | 14.4 | 18 |
| JSR SIS-5000 | 20.0 | — |
| Properties | | |
| Viscosity (mPa) | 3400 | 850 |
| Impact Strength | | |
| at 4° C. | 2.4 | 1.3 |
| at 25° C. | 4.2 | 0.9 |
| TLS Strength | | |
| at 0° C. | 1.6 | 0.6 |
| at 25° C. | 1.5 | 1.0 |

*Atactic polypropylene having a R&B of 115° C., available from Chisso Co.

EXAMPLES 45 AND 46

The compositions and properties of the adhesives prepared in these Examples were as follows.

TABLE XV

| Component | 45 | 46 |
|---|---|---|
| Polypropylene* | 45.7 | 40.8 |
| ARKON P-125 | 28.5 | 25.4 |
| Wax** | 10.4 | 9.4 |
| Polyethylene*** | 10.4 | 9.4 |
| KRATON G-1657 | 5.0 | 15.0 |
| Properties | | |
| Viscosity (mPa) | 1,900 | 6,680 |
| Impact Strength | | |
| at 4° C. | 1.8 | 5.0 |
| at 25° C. | 3.3 | 17.9 |
| TLS Strength | | |
| at 0° C. | 5.5 | 17.0 |
| at 25° C. | 24.7 | 18.3 |

*Atactic polypropylene having a R&B of 145° C.
**Fischer-Tropsch Wax having R&B of 108° C.
***Low molecular weight polyethylene having a R&B of 102° C.

FIGS. 2-5 are photomicrographs of the compositions of the adhesives prepared in Examples 45 and 46. Test specimens were prepared by immersing a sample of the adhesive composition being studied in a 1 percent aqueous solution of ruthenium tetroxide for 24 hours, cutting by means of a common microtome, and then examining with a trasmission-type electron microscope. The phase-separation structure of the adhesive compositions provided by the invention are readily in FIGS. 2-5.

Various modifications and alterations of this invention will become apparent to those skilled in the art without departing from the scope and spirit of this invention.

What is claimed is:

1. A composition consisting essentially of the following:
   (a) between about 10 and about 70 weight percent of amorphous polypropylene;
   (b) between about 2 and about 70 weight percent of styrene-based thermoplastic elastomer, said elastomer being styrene-diene block copolymer or hydrogenated styrene-diene block copolymer;

(c) between about 1 and about 35 weight percent of tackifier: and (d) up to about 24 weight percent of wax;

and having a dissipation factor of about 0.010 or less at 1 kilohertz at 23° C., and a volume resistivity of at least about $1 \times 10^{14}$ ohm-cm at 23° C.

2. The composition of claim 1 consisting essentially of the following:

(a) between about 14 and about 50 weight percent of said amorphous polypropylene;

(b) between about 2 and about 60 weight percent of said styrene-based elastomer;

(c) between about 1 and about 25 weight percent of said tackifier; and (d) up to about 24 weight percent of said wax.

3. The composition of claim 1 wherein said amorphous polypropylene has a weight average molecular weight between about 10,000 and about 100,000.

4. The composition of claim 1 wherein said amorphous polypropylene has a weight average molecular weight between about 10,000 and about 50,000.

5. The composition of claim 1 wherein said amorphous polypropylene comprises at least one of: atactic polypropylene, and propylene copolymerized with a low molecular weight alkene.

6. The composition of claim 1 wherein said styrene-based elastomer has a repeating structure of A-B or A-B-A wherein A is polystyrene and B is a compatible soft segment copolymer.

7. The composition of claim 6 wherein said A blocks have a weight average molecular weight of between about 5,000 and about 125,000.

8. The composition of claim 6 wherein said A blocks have a weight average molecular weight of between about 8,000 and about 45,000.

9. The composition of claim 7 wherein said B blocks has a weight average molecular weight of between about 30,000 and about 125,000.

10. The composition of claim 6 wherein said B blocks have a weight average molecular weight of between about 50,000 and about 100,000.

11. The composition of claim 6 wherein the weight ratio of said A blocks to said B blocks is between about 1:4 and about 4:1.

12. The composition of claim 1 wherein said styrene-based thermoplastic elastomer comprises blocks of hard segments and blocks of soft segments, said soft segments being substantially saturated.

13. The composition of claim 1 wherein said tackifier is at least one of the following: polyterpenes, rosins, rosin esters and derivatives thereof, aliphatic and aromatic resins, modified terpenes, coumarone-indenes, polyesters, alkyl phenols, or styrene oligomers.

14. The composition of claim 1 wherein said wax is at least one of the following: low molecular weight polyethylene, microcrystalline wax, Fischer-Tropsch wax, or paraffin wax.

15. The composition of claim 1 further comprising at least one of the following: crystalline polyolefin, filler, colorant, or stabilizer.

16. The composition of claim 1 wherein said composition has a volume resistivity of between about $10^{14}$ and about $10^{17}$ ohm-cm at 23° C., a dielectric strength of between about 25 and about 50 kilovolts/millimeter, a dielectric constant of between about 2.3 and about 3.0 at 1 kilohertz, a dissipation factor of between about 0.0008 and about 0.010 at a 1 kilohertz at 23° C., and electrolytic corrosion after 1000 hours of between about $10^{10}$ and about $10^{12}$ ohms.

17. A method of bonding electronic components said method comprising using a composition consisting essentially of the following:

(a) between about 10 and about 70 weight percent of amorphous polypropylene;

(b) between about 2 and about 70 weight percent of styrene-based thermoplastic elastomer;

(c) between about 1 and about 35 weight percent of tackifier; and (d) up to about 24 weight percent of wax;

wherein said composition has a dissipation factor of about 0.010 or less at 1 kilohertz at 23° C., and a volume resistivity of at least about $1 \times 10^{14}$ ohm-cm at 23°C.

* * * * *

UNITED STATES PATENT AND TRADEMARK OFFICE
CERTIFICATE OF CORRECTION

PATENT NO. : 5,026,752

DATED : June 25, 1991

INVENTOR(S) : Toshinori Wakabayashi et al.

It is certified that error appears in the above-identified patent and that said Letters Patent is hereby corrected as shown below:

On the front page, add the following priority information:

-- [30] Foreign Application Priority Data

Apr. 3, 1987 [JP] Japan ........... 62-82778--

On the front page under heading FOREIGN PATENT DOCUMENTS, the word "Austria" should read --Australia--.

In Col. 4, Line 3, delete the word "be".

In Col. 5, Line 5, the second word "be" should read --by--.

In Col. 7, Line 27, "centimeter" should read --centimeter$^2$--.

In Col. 7, Line 40, delete the comma after "centimeter$^2$" and insert a period.

In Col. 9, Line 45, "hotmelt" should read --hot melt--.

In Col. 9, Line 46, "eachcomposition" should read --each composition--.

In Col. 17, Line 5, delete the colon after the word "tackifier" and insert a semicolon.

In Col. 17, Line 8, after "23°C," insert --an electrolytic corrosion after 1000 hours of between about $10^{11}$ and about $10^{12}$ ohms--

UNITED STATES PATENT AND TRADEMARK OFFICE
CERTIFICATE OF CORRECTION

PATENT NO. : 5,026,752

DATED : June 25, 1991

INVENTOR(S) : Toshinori Wakabayashi et al.

It is certified that error appears in the above-identified patent and that said Letters Patent is hereby corrected as shown below:

In Col. 18, Line 30, "$10^{10}$" should read --$10^{11}$--.

In Col. 18, Line 33, after the word "comprising" insert --bonding together the electronic components--.

Signed and Sealed this

Third Day of December, 1991

Attest:

HARRY F. MANBECK, JR.

*Attesting Officer*  *Commissioner of Patents and Trademarks*